United States Patent [19]

Hofmann

[11] Patent Number: 5,047,766

[45] Date of Patent: Sep. 10, 1991

[54] BROAD BAND SIGNAL SWITCHING MATRIX

[75] Inventor: Ruediger Hofmann, Gilching, Fed. Rep. of Germany

[73] Assignee: Siemens Aktiengesellschaft, Munich, Fed. Rep. of Germany

[21] Appl. No.: 285,303

[22] Filed: Dec. 15, 1988

Related U.S. Application Data

[63] Continuation of Ser. No. 918,477, Oct. 14, 1986, abandoned.

[30] Foreign Application Priority Data

Oct. 22, 1985 [DE] Fed. Rep. of Germany ....... 3537562

[51] Int. Cl.$^5$ .............................................. H04Q 3/52
[52] U.S. Cl. ...................... 340/825.850; 340/825.87; 340/825.91; 340/825.93; 307/241; 307/585; 379/292
[58] Field of Search ...................... 340/825.85, 825.86, 340/825.87, 825.89, 825.9, 825.91, 825.93; 307/241, 443, 451, 452, 473, 481, 571, 572, 585; 379/54, 94, 291, 292; 370/58; 358/181

[56] References Cited

U.S. PATENT DOCUMENTS

| | | | |
|---|---|---|---|
| 3,720,848 | 3/1973 | Schmidt, Jr. .......................... | 307/579 |
| 3,980,831 | 9/1986 | Mertel ................................... | 379/291 |
| 4,024,352 | 5/1977 | Mukaemachi et al. .............. | 340/825.91 |
| 4,346,381 | 8/1982 | Bauch et al. ......................... | 340/825.86 |
| 4,491,839 | 1/1985 | Adam .................................... | 340/825.91 |
| 4,590,396 | 5/1986 | Koike .................................... | 307/443 |
| 4,709,173 | 11/1987 | Wishimichi et al. ................. | 307/585 |
| 4,745,409 | 5/1988 | Hofmann .............................. | 340/825.87 |
| 4,746,921 | 5/1988 | Hofmann .............................. | 340/825.87 |
| 4,785,299 | 11/1988 | Trumpp .................................. | 340/825.89 |
| 4,792,801 | 12/1988 | Hofmann .............................. | 340/825.91 |
| 4,801,936 | 1/1989 | Hofmann .............................. | 340/825.91 |

FOREIGN PATENT DOCUMENTS

| | | | |
|---|---|---|---|
| 0193125 | 11/1982 | Japan ................................... | 307/473 |
| 0178792 | 9/1985 | Japan ................................... | 340/825.93 |

OTHER PUBLICATIONS

Pfannschmidt H., "Arbeitsgeschwindigkeitsgrenzen ... Digital-Signzle", Technical University, Braunschweig, 1978, pp. 121-125.

McMos Handbook, Oct. 1973, (Motorola Inc.) pp. 38-39.

"Switching Matrix Delivers 100 Mbls", Electronics, Dec. 15, 1983, p. 88, Robert T. Gallagher.

ISS '84 Conference Papers, 23C1, FIG. 9., p. 7.

Industrial Use C$^2$MOS $^{TM}$ IC, Toshiba Review, No. 95, Jan.-Feb. 1975, pp. 20-25, Yamaga et al.

*Primary Examiner*—Donald J. Yusko
*Assistant Examiner*—Edwin C. Holloway III
*Attorney, Agent, or Firm*—Hill, Van Santen, Steadman & Simpson

[57] ABSTRACT

In a broad band signal spaced coupling device comprising a cross point matrix whose switching matrix elements are respectively controllable by a decoder-controlled, cross point-associated memory cell, the cross points are respectively formed with a complementary metal-oxide-semiconductor transfer gate and the useful signal input of each such gate is preceded by a complementary metal-oxide-semiconductor inverter.

1 Claim, 2 Drawing Sheets

5,047,766

BROAD BAND SIGNAL SWITCHING MATRIX

This is a continuation of application Ser. No. 918,477, filed Oct. 14, 1986, now abandoned.

BACKGROUND OF THE INVENTION

1. Field of the Invention

The present invention relates to a broad band signal spaced coupling device, and more particularly to a device which comprises a cross point matrix whose switching matrix elements are respectively controlled by a decoder-controlled, cross point-associated memory cell which are respectively formed with a complementary metal-oxide-semiconductor transfer gate, the useful signal input of every such transfer gate being preceded by a complementary metal-oxide-semiconductor inverter.

2. Description of the Prior Art

Recent developments in telecommunications technology have led to service intergrating communications transmission and switching systems for narrow band and broad band communications services which provide light wave guides as the transmission medium in the area of the subscriber lines by way of which both the narrow band communications services such as, in particular, 64-kbit/s digital telephony, as well as broadband communication services, such as, in particular, 140-Mbit/s picture telephony, are conducted, whereby, however, a narrow band signal switching devices and broad band signal switching devices are provided in the switching centers (preferably having shared control devices) such as disclosed in the German patent 24 21 002.

In conjuction with a broad band time-division multiplex switching matrix device whose cross points are used in time-division multiplex for a respective plurality of connections, it is known in the art to connect two respective lines with the assistance of a gate element which is switched on and off by a cross point associated memory cell formed as a bi-stable D-flip-flop, whereby the cross point-associated memory cell whose clock input is supplied with an appropriate clock signal, is driven in only one coordinate direction, and particular, at its D-input (Pfannschmidt, "Arbeitsgeschwindigkeits-grenzen von Koppelnetzwerken fuer Breitband-Digitalsignale", dissertation, Braunschweig, 1978, FIG. 6.7). In view of the time-division multiplex factor of about 4-8, which can be achieved given a bit rate of 140 Mbit/s and in view of the involved circuit technology required, exclusive space-coupling devices are, however, currently preferred for switching broad-band signals, the connections being made by way of the individual cross points being separated from one another only in terms of space.

An exclusive broad band signal space coupling device can be constructed as a cross point matrix in whose cross points the switching elements are respectively controlled by a decoder-controlled, cross point-associated holding memory cell (see Pfannschmidt, op. cit., FIG. 6.4; Electronics, Dec. 15, 1983, pp. 88-89); the switching elements can thereby be respectively constructed as CMOS transfer gates (ISS'84 Conference Papers 23C1, FIG. 9). The utilization of a simple CMOS transfer gate as a switching element, however, is connected, given the through-connected condition, with a load of its input line due to the capacitance of its output line, this circumstances producing signal delays; as a consequence of what are referred to as under-threshold effects (for example, in the form of stray currents or under threshold currents), along the MOS transistors, moreover, cross talk phenomena occur across switching matrix elements located in their inhibited condition can occur.

SUMMARY OF THE INVENTION

In a broad band spaced coupling device, it is then the object of the present invention to provide a manner to achieve an especially advantageous design of the switching matrix elements, given which the disadvantages set forth above are avoided.

The present invention relates to a broad band switching coupling device comprising a cross point network whose switching matrix elements respectively controllable by a decoder-controlled, cross point-associated memory cell are respectively formed with a CMOS transfer gate. The broad band spaced coupling device, according to the present invention, is particularly characterized in that the useful signal input of the CMOS transfer gate is preceded by a CMOS inverter circuit.

In addition to the advantage of the complete decoupling of output and input lines and the elimination of cross-talk problems resulting therefrom, the present invention provides the further advantage of a high operating speed since, first of all, reactions of the output line capacitance on the input line are avoided and, secondly, although the inverter transit time is added, the inverter circuit, acting as a driver buffer for the output line, simultaneously and noticeably increases the edge steepness of the through-connected signals.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
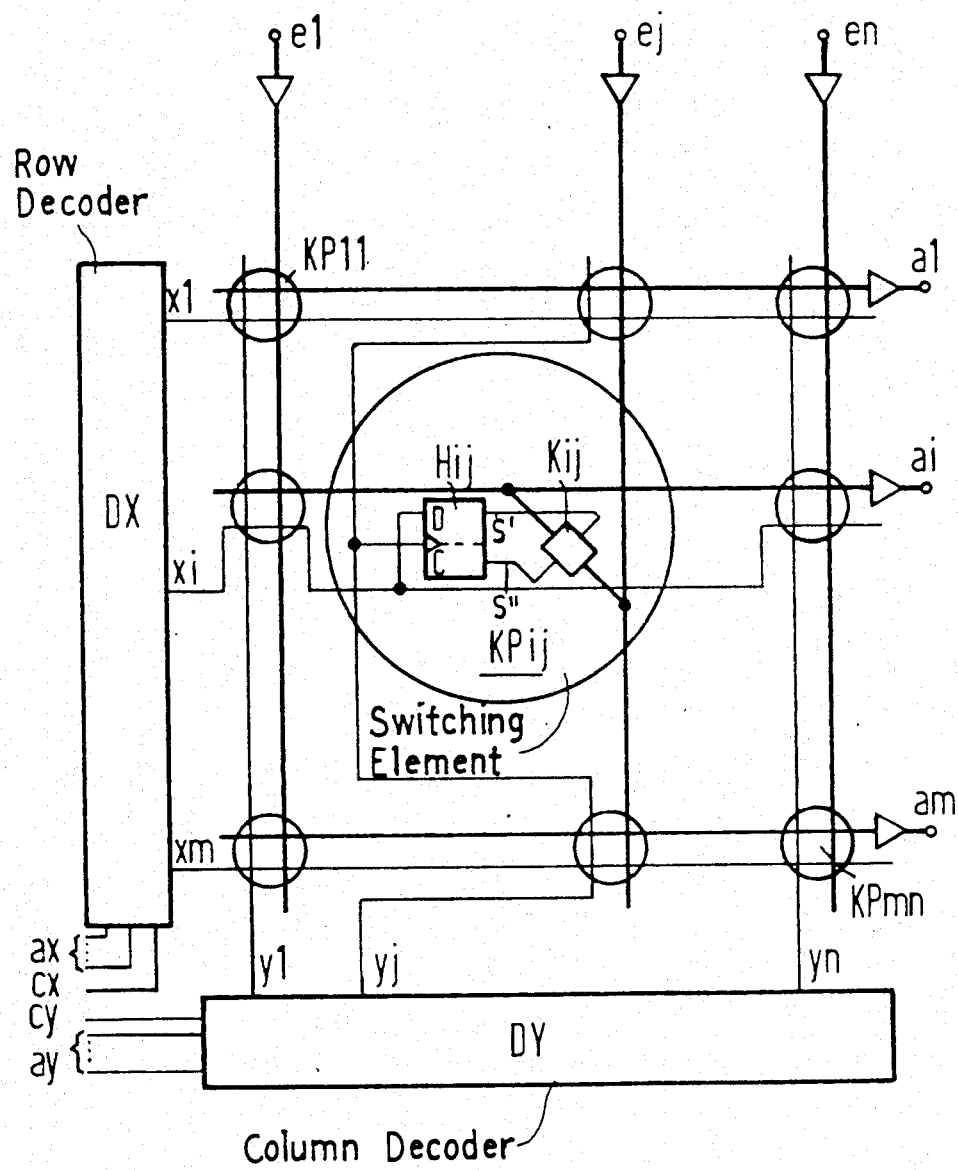
FIG. 1 is a schematic representation of a exemplary embodiment of a broad band switching matrix network.

FIG. 1 of the drawings schematically illustrates a broad band space switching device to an extent necessary for an understanding of the present invention. The space switching device comprises a cross point matrix having cross points KPl1 . . . Kpij . . . Kpmn whose switching matrix elements, as indicated in greater detail for the switching matrix element Kij of the cross point KPij, are respectively controlled by a cross point-associated holding memory cell Hij (in the case of the cross point KPij). The holding memory cell Hij (in the case of the cross point KPij) is formed by a D-flip-flop whose two outputs s' and s" are connected to corresponding control inputs of the respective switching element (Kij in the case of the cross point KPij).

The holding memory cells . . . Hij . . . are in turn driven by two selection decoders, in particular, a row decoder DX and a column decoder DY, being selected in two coordinate directions by way of corresponding selection lines xl . . . xi . . . xm; yl . . . yj . . . yn. The decoder Dx selects in the row direction and has its respective decoder outputs . . . xi . . . connected to the D-inputs of the D-flip-flops . . . Hij . . . arranged in the appertaining matrix row, in the $i^{th}$ row in the present example, whereas the decoder DY selects in the column direction and has its respective decoder outputs . . . yj . . . connected to the clock inputs C of the D-flip-flops . . . Hij . . . arranged in the appertaining matrix column, for example, in the $j^{th}$ column.

As may be seen from FIG. 1, the two selection decoders DX, DY are respectively chargeable with a cross point row or, respectively, cross point column address shared by a matrix line (row or column) of crosspoints via input lines ax, ay and are respectively chargeable with an address clock signal via input line cx, cy in response to which they respectively emit a selection signal in due time to the selection line corresponding to the respective cross point line address.

The coincidence of a row selection signal and of a column selection signal at the intersection of the appertaining matrix row with the appertaining matrix column when setting up a corresponding connection then effects an activation of the holding memory cell located at that point, for example, the holding memory cell Hij, with the result that the switching matrix element controlled by the appertaining holding memory cell (Hij) is activated, in this case, the switching matrix element Kij.

In order for the switching matrix element Kij considered in this example to be in turn inhibited upon clearing of the appertaining connection, the emission of only a corresponding column selection signal by the column decoder DY by way of its selection line yj suffices, without having the row decoder DX emit a selection signal by way of its row selection line xy. The control signal appearing only at the clock input C of the holding memory cell Hij belonging to the cross point KPij then effects the resetting of the holding memory cell Hij, with the result that the switching matrix element Kij control thereby is inhibited.

At the respective outputs s', the individual holding memory cells . . . Hij . . . respectively output a voltage ($U_{DD}$) signal corresponding to a feed potential $U_{DD}(+5 V)$ of CMOS circuits or a ($U_{SS}$)signal corresponding to the other feed potential $U_{SS}$(ground) of CMOS circuits and provide that they output the respectively other ($U_{SS}$ or, respectively, $U_{DD}$) signal at the other output s". Further details of the circuit-oriented realization of the holding memory cells . . . Hij . . . need not be discussed herein since the same is not required for an understanding of the invention. Such details, however, are already disclosed, for example, in the German application 35 33 915.2, fully incorporated herein by this reference.

Figure 2:
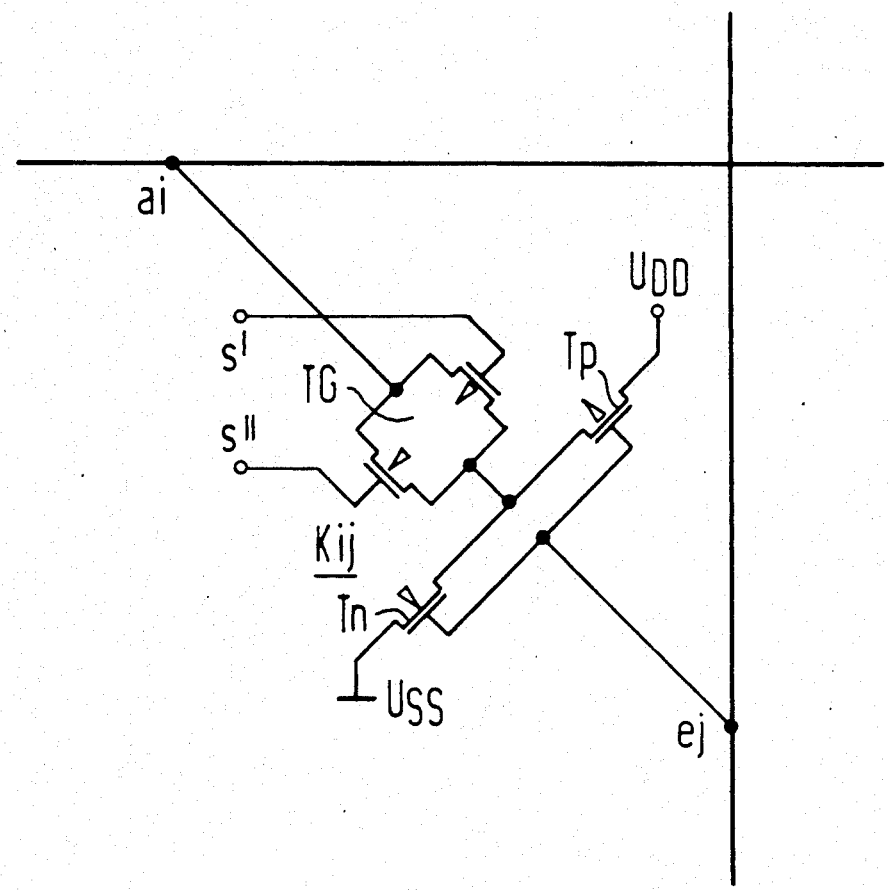
FIG. 2 is a schematic circuit diagram of the details of a circuit-oriented realization constructed in accordance with the present invention.

FIG. 2 illustrates the details of the circuit-oriented realization of the switching matrix elements . . . Kij . . . . In accordance with FIG. 2, a switching matrix element comprises a CMOS transfer gate TG which is known per se (for example, from McMos Handbook, 1973, page 3.9, FIG. 11), whereby the "useful" signal input of the CMOS transfer gate TG is then preceeded by a CMOS inverter circuit Tp, Tn. The input ej of the CMOS inverter circuit Tp, Tn, therefore, that of the switching matrix element Kij, as well, is therefore connected to the appertaining input line of the cross point matrix whose input lines are referenced el . . . ej . . . en in FIG. 1. The output ai of the switching matrix element Kij is connected to the appertaining output line of the cross point matrix whose output lines are referenced al . . . ai . . . am in FIG. 1.

When, proceeding from the holding memory cell Hij (FIG. 1), the potential $U_{SS}$ is connected to the control input s' and the potential $U_{DD}$ is connected to the control input s", then the switching matrix element Kij is in its through-connected condition. Amplified and inverted in the inverter, digital signals appearing at the input ej therefore proceed to the output ai, whereby a reaction of the output ai onto the input ej is simultaneously suppressed by the inverter Tp, Tn.

When, proceeding from a holding memory cell Hij (FIG. 1), the potential $U_{DD}$ is connected to the control input s' of the switching matrix element Kij and the potential $U_{SS}$ is connected to the control input s", then the switching matrix element Kij is in its inhibited condition (tri-state condition), so that no signals appearing at the input ej proceed to the output ei. Simultaneously, the inverter circuits of the inhibited switching matrix elements of the cross point matrix KPll . . . KPij . . . KPmn (FIG. 1) suppress a cross talk between the output lines al . . . ai . . . am (FIG. 1) and the input lines el . . . ej . . . en (FIG. 1) via such inhibited cross points.

Although I have described my invention by reference to a particular illustrative embodiment thereof, many changes and modifications may become apparent to those skilled in the art without departing from the spirit and scope of the invention. I therefore intend to include within the patent warranted hereon, all such changes and modifications as may reasonably and properly be included within the scope of my contribution to the art.

I claim:

1. A broadband switching matrix comprising:
a plurality of row lines;
a plurality of column lines;
a plurality of select lines respectively associated with said row and column lines;
said row and column lines intersecting to form a plurality of crosspoints; and
at each crosspoint, a holding memory cell having inputs connected to select lines for the crosspoint, a complementary metal-oxide-semiconductor inverter and a complementary metal-oxide-semiconductor transfer gate having a controlled conductive path connected in series in the path connecting the row and column lines present at the crosspoint, the inverter having an output connected to the conductive path input of the transfer gate, and said transfer gate having control signal inputs connected to and controllable by said holding memory cell in response to signals on said select lines.

* * * * *